(12) United States Patent
Menkhoff et al.

(10) Patent No.: US 10,044,322 B2
(45) Date of Patent: Aug. 7, 2018

(54) RADIO FREQUENCY SIGNAL SYNTHESIZER CIRCUIT AND METHOD FOR GENERATING A RADIO FREQUENCY SIGNAL

(71) Applicant: Intel IP Corporation, Santa Clara, CA (US)

(72) Inventors: Andreas Menkhoff, Oberhaching (DE); Zdravko Boos, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/609,041

(22) Filed: May 31, 2017

(65) Prior Publication Data

US 2018/0006606 A1    Jan. 4, 2018

(30) Foreign Application Priority Data

Jul. 1, 2016  (EP) .................................. 16177568

(51) Int. Cl.

| *H04B 1/40* | (2015.01) |
| *H03D 7/16* | (2006.01) |
| *H04B 1/00* | (2006.01) |
| *H04B 1/403* | (2015.01) |
| *H03J 1/00* | (2006.01) |
| *H03B 21/02* | (2006.01) |
| *G06F 1/02* | (2006.01) |

(52) U.S. Cl.
CPC ............. *H03D 7/16* (2013.01); *G06F 1/022* (2013.01); *H03B 21/02* (2013.01); *H03D 7/163* (2013.01); *H03J 1/0033* (2013.01); *H04B 1/005* (2013.01); *H04B 1/406* (2013.01)

(58) Field of Classification Search
CPC .......... H03D 7/16; H03D 7/163; H04B 1/005; H04B 1/406; H04B 1/0082
See application file for complete search history.

(56) References Cited

U.S. PATENT DOCUMENTS

| 2004/0176058 A1* | 9/2004 | Johnson | ................. | H03C 3/403 |
| | | | | 455/147 |
| 2009/0311979 A1* | 12/2009 | Husted | ..................... | H03C 5/00 |
| | | | | 455/102 |
| 2011/0188604 A1 | 8/2011 | Wagner | | |
| 2012/0225629 A1* | 9/2012 | Shi | ......................... | H04L 27/14 |
| | | | | 455/182.2 |
| 2014/0119476 A1 | 5/2014 | Marsili et al. | | |

* cited by examiner

*Primary Examiner* — Tuan Pham
(74) *Attorney, Agent, or Firm* — 2SPL Patentanwaelte PartG mbB; Mani Arabi (57) ABSTRACT

A radio frequency signal synthesizer circuit includes a digital to analog converter configured to generate an analog output signal for each clock cycle of a clock signal to provide the radio frequency signal and a controlled oscillator to generate the clock signal. The controlled oscillator is configured to vary a cycle time of the clock signal for a radio frequency signal in a first frequency range in a first operation mode or to maintain a constant cycle time for a radio frequency signal in a second frequency range in a second operation mode, the second frequency range being different than the first frequency range.

24 Claims, 6 Drawing Sheets

FIG. 6 in a first operation mode for a first frequency range, vary a cycle time of a clock signal; and generate an analog output signal for each clock cycle of a clock signal using an analog to digital converter — 602 change frequency range — 603 in a second operation mode for a second frequency range, maintain a constant cycle time of the clock signal; and generate an analog output signal for each clock cycle of the clock signal using the analog to digital converter — 604

FIG. 7

RADIO FREQUENCY SIGNAL SYNTHESIZER CIRCUIT AND METHOD FOR GENERATING A RADIO FREQUENCY SIGNAL

FIELD

Examples relate to radio frequency signal synthesizer circuits to generate radio frequency signals, for example for mobile telecommunication devices.

BACKGROUND

Modern RF transmitters support a variety of frequency bands. A transmitter for a mobile telecommunication network being compatible with several of the Third Generation Partnership (3GPP) standards may require support for the following bands or frequency ranges:
- 4 Low Bands between 698 . . . 915 MHz, Band 5, 6, 8, 12, 13, 14, 17, 18, 19, 20, 26, 27, 28, 44.
- 3 Mid Bands, Band 11 and 21 at 1428 . . . 1463 MHz plus band 24 at 1626 . . . 1661 MHz.
- 14 High Bands between 1710 . . . 2025 MHz.: Band 1,2,3,4,9,10, 23,25, 33,34,35,36,37,39.
- 5 Bands around 2.5 GHz between 2300 . . . 2690 MHz.: Band 7, 30,38,40,41.
- 2 Bands around 3.5 GHz between 3400 . . . 3800 MHz.: Band 42 and 43.
- 4 GSM Bands.

Given that a ratio between the lowest and the highest supported frequency range of a single Controlled Oscillator (DCO) is typically around 1.3 to 1.4, multiple DCO's are required to fulfill such a compatibility requirement. For polar transmitters also the instantaneous frequency modulation range has to be considered, further reducing the supported range of carrier frequencies of a single DCO. To support one or several transmission bands, each DCO additionally requires an associated Digital to Analog Converter (DAC) and an upsampling filter chain. In summary, the more DCO's are used, the more engineering time is needed to design, layout, test and verify the associated transmit (Tx) chains, each consisting of wiring, digital filter, DCO and DAC. Additionally, each transmit chain requires a considerable amount of chip area and contributes to the overall power consumption.

It would be beneficial to reduce the number of DCO's to save on chip area, production cost, and engineering time for design, layout, test and verification.

BRIEF DESCRIPTION OF THE FIGURES

Some examples of apparatuses and/or methods will be described in the following by way of example only, and with reference to the accompanying figures, in which FIG. 1 schematically illustrates an example of a radio frequency signal synthesizer circuit comprising a controlled oscillator and a digital to analog converter.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
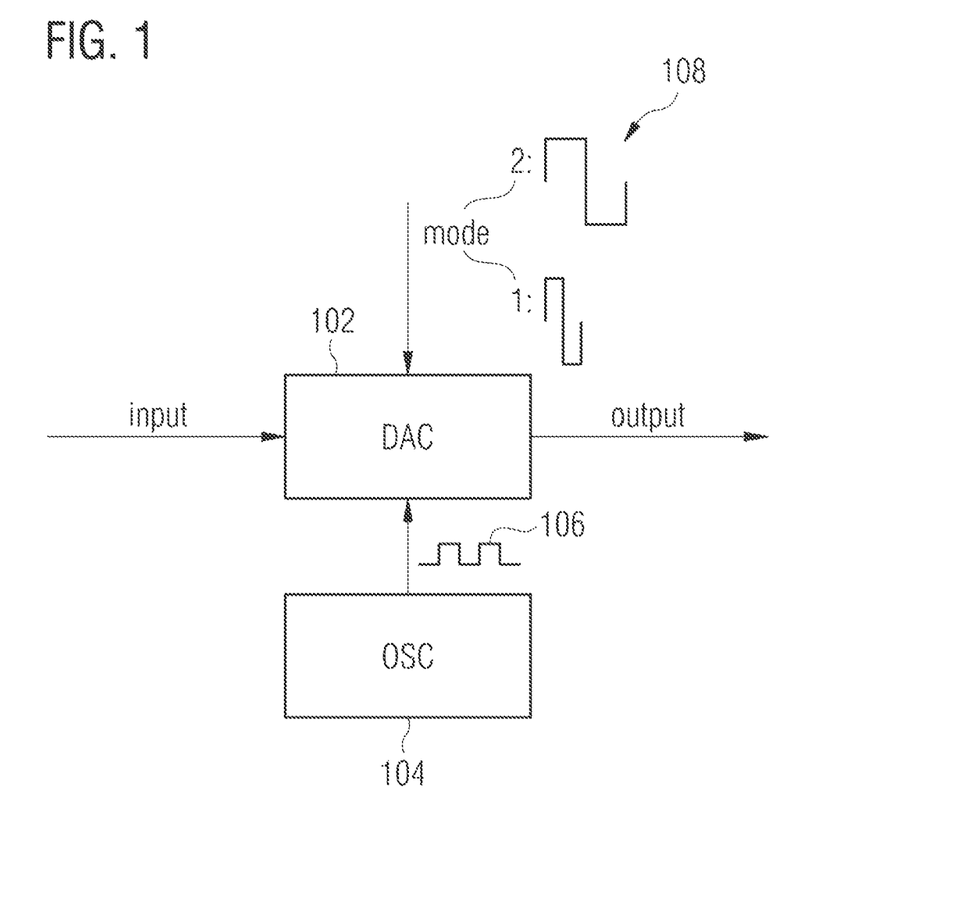

FIG. 1 schematically illustrates an example of a radio frequency signal synthesizer circuit comprising a controlled oscillator 104 and a digital to analog converter 102. A controlled oscillator may, for example, be a digitally controlled oscillator (DCO/NCO) or a Voltage Controlled Oscillator (VCO).

The digital to analog converter 102 is configured to generate an analog output signal 108 for each clock cycle of a clock signal 106 to contribute to the radio frequency signal.

The controlled oscillator 104 generates the clock 106 signal and is configured to vary a cycle time of the clock signal for a radio frequency signal in a first frequency range in a first operation mode or to maintain a constant cycle time for a radio frequency signal in a second frequency range in a second operation mode, the second frequency range being different than the first frequency range. When using an analog-to-digital converter and a controlled oscillator cooperating in different modes according to the examples described herein, the overall frequency range that can be covered without requiring an additional oscillator and its associated processing circuitry can be increased.

In the first mode, in which a phase modulation of the resultant radio frequency signal may be generated using the variation of the cycle time of the clock signal, high frequency ranges up to a maximum supported frequency of the controlled oscillator can be generated. In this operation mode, which is also referred to as polar modulation, the phase of the resultant radio frequency signal is modulated by means of the cycle time variation of the clock signal, while the amplitude or radius is generated by means of the magnitude of the output of the DAC 102. If an oscillator supporting high frequencies for the generation of a radio frequency signal according to the first operation mode is present, the controlled oscillator together with the associated DAC 102 can also be used to generate a radio frequency signal of, for example, a lower frequency range, with the cycle time of the controlled oscillator 104 being maintained constant.

For example, a waveform of the radio frequency signal may be provided to an input of the DAC 102 so that the DAC is operating on the radio frequency waveform of the digital domain so as to directly synthesize the analog waveform of the radio frequency signal. The latter operation mode is, therefore, also referred to as direct digital synthesis (DDS). If an analog-to-digital converter together with an associated controlled oscillator are present which are capable of generating radio frequency signals according to the first operation mode, a processing hardware already exists that can operate at a clock rate of the radio frequency in the first operation mode. Therefore, digitally generating the radio frequency waveform for the lower frequency range before inputting the same into the DAC comes at almost no cost, since the circuitry is already capable of performing the necessary mixing or modulation required to directly digitally synthesize the waveform of the radio frequency signal within another frequency range. This is because the generation of the signal according to the first mode and according to the second mode is different, as illustrated in FIG. 3.

Figure 3:
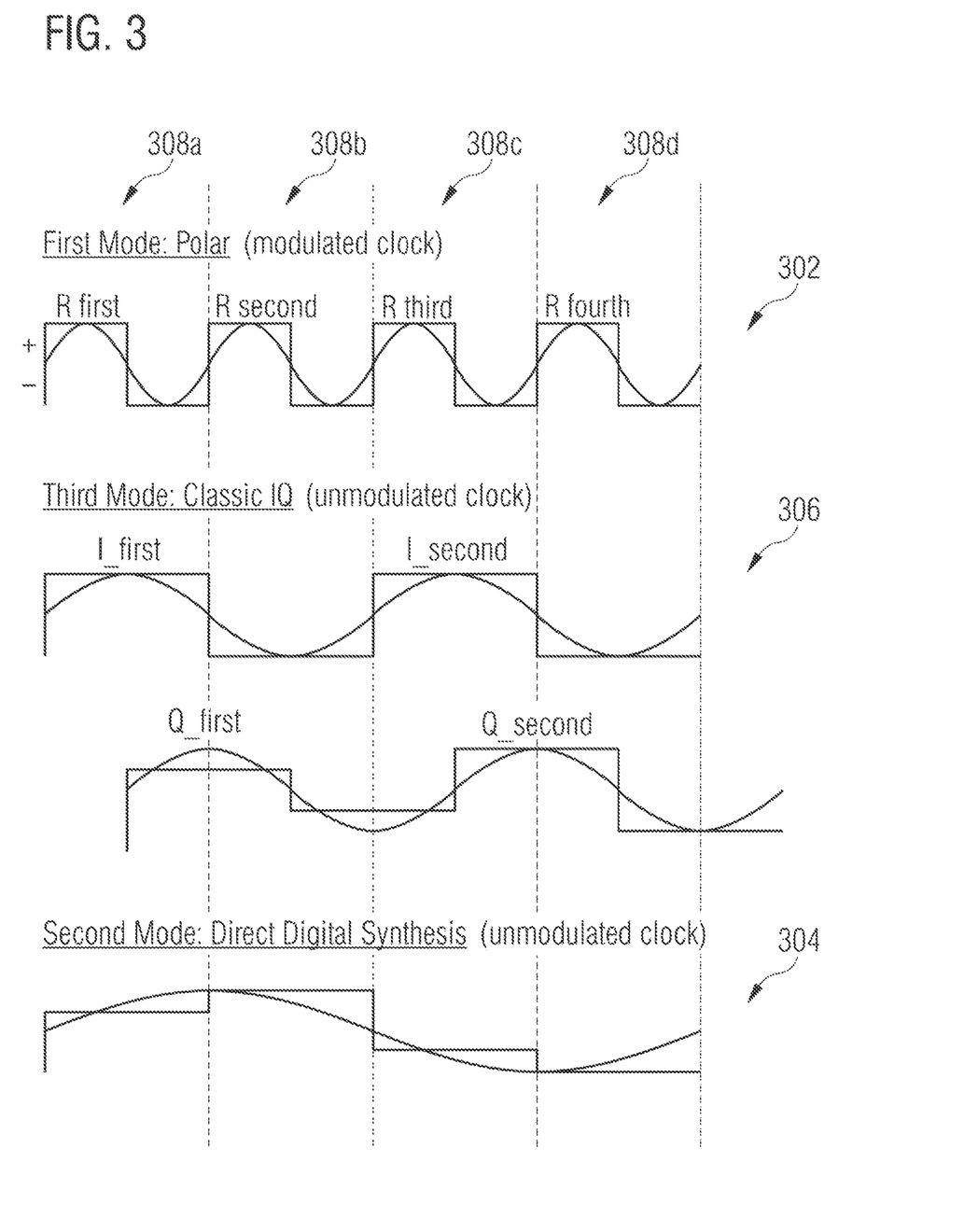
FIG. 3 illustrates 3 different modes for synthesis of a radio frequency signal.

FIG. 3 illustrates the first mode of operation in the upper graph 302 and the second mode of operation in the lower graph 304, while the middle graph 306 illustrates a further, optional, third mode of operation to generate a radio frequency signal. For each of the operation modes illustrated in FIG. 3, the output of the digital-to-analog converter 102 is illustrated for four clock cycles 308*a*-308*d* of the clock signal 106 as provided by the controlled oscillator 104.

In summarizing FIG. 3, in every mode the same number of four digital samples is fed to the DAC though the DAC outputs different channel frequencies. To this end, the term channel frequency should be understood as a frequency within the spectrum of the generated radio frequency signal, e.g. the center frequency of the spectrum or a frequency close thereto.

In the first Mode, the DAC 102 works in Polar operation.
Four radius samples R_first to R_fourth are fed to the DAC 102. The channel frequency is modulated around 'x-MHz', x being given by the mean frequency of the DCO. The first frequency range of the radio frequency signal generated by the DAC 102 in the first operation mode is given by the frequency range of the clock signal 106.

In the second Mode the, DAC 102 may work in Direct Digital Synthesis (DDS) operation. In the illustrated example, four samples are used in direct digital synthesis in order to represent a full cycle of the radiofrequency signal generated according to the second mode. It is assuming that the baseband signal is based on an in-phase (I) component and on a quadrature (Q) component. The baseband signal is multiplied with a mixing frequency of one fourth of the operating frequency of the DAC to result with four samples per full cycle of the radio frequency signal. This may, for example, be easily achieved using an additional mixer or multiplier in the digital domain before the radiofrequency DAC 106. While FIG. 3 illustrates a particularly simple example, having an integer ratio between the operating frequency of the radio frequency DAC 106 and the frequency of the channel (the center frequency of the frequency range of the radio frequency signal generated using DAC 106 in the second operation mode), further examples may use other channel frequencies. To this end, the baseband signal can be multiplied with a mixing signal having another mixing frequency in order to support multiple bands. In other words, in the second operation mode, the frequency range of the resultant signal (the channel frequency) is given by a mixing frequency and not by the operating frequency of the radiofrequency DAC, as it is the case in the first operation mode. In summary, in this example four samples are fed forward to one DAC per cycle of the resultant radio frequency signal. The channel frequency clock is not modulated. The frequency in this particular example is one quarter of the frequency used in Polar operation The second mode supports a much wider range of frequencies, i.e. further examples can provide other second frequency ranges, for example second frequency ranges being lower than a quarter of the operating frequency of the DAC.

In the third, optional, operation mode, the DAC works in classical IQ operation. For four clock cycles of the DAC, two in-phase and two quadrature samples are fed through the DAC 106 or through two separated I and Q DACs. The channel frequency clock is not modulated. The center frequency of the resultant radio frequency signal, therefore, is half of the operating frequency of the DAC, i.e. half of the frequency of the oscillation signal.

From the different operation modes illustrated in FIG. 3, it becomes apparent that different channel frequencies can be supported using the identical controlled oscillator 104 and its associated DAC 102, if those are alternatively operated in two or three of the different operation illustrated in FIG. 3.

In other words, FIG. 1 illustrates the input and output ports of the DAC 102 and an associated controlled oscillator 104 giving the operating frequency of the DAC. The DAC has a digital input and analog output port. In one example, the clock for the DAC may be either modulated for polar mode in a first operation mode or unmodulated for the second or third operation modes. A 'Mode' port of the DAC can be used to define the presently used operation mode of the DAC.

If a given hardware is capable of supporting the first mode of operation within a first frequency range, a lower second frequency range can be covered in the second operation mode. The frequency range of the second mode may even be wider than the one feasible in the first mode. The analog-to-digital converter is configured to output a single amplitude value for a full cycle of the radiofrequency signal at a time instant given by the clock cycle of the clock signal in the first operation mode. Contrary thereto, in the second operation mode, the analog-to-digital converter is configured to output one of multiple samples of a full cycle of the radiofrequency signal per clock cycle of the clock signal only. Multiple samples output by the digital-to-analog converter 102 constitute a single cycle of the radio frequency signal. The number of samples can in principle be made arbitrarily high at a sufficient granularity of the system. The frequency supported in the second operation mode principally starts at 0 Hz and extends up to an upper limit given by the maximum frequency of the controlled oscillator 104. For example, a frequency range coverable in the second operation mode may start at 0 Hz and end at 50% of the maximum frequency of the controlled oscillator 104. According to further examples, the frequency range coverable in the second operation mode may end at 40% of maximum frequency or at 30% of maximum frequency. According to further examples, the frequency range supported in the first operation mode can also be higher, i.e. the bandwidth of the controlled oscillator can be higher. For example, Polar Modulators may be used for the first mode that have a high bandwidth. One implementation having a higher bandwidth oscillator may use Digital to Time Converters (DTC) to generate the clock signal.

Figure 2:
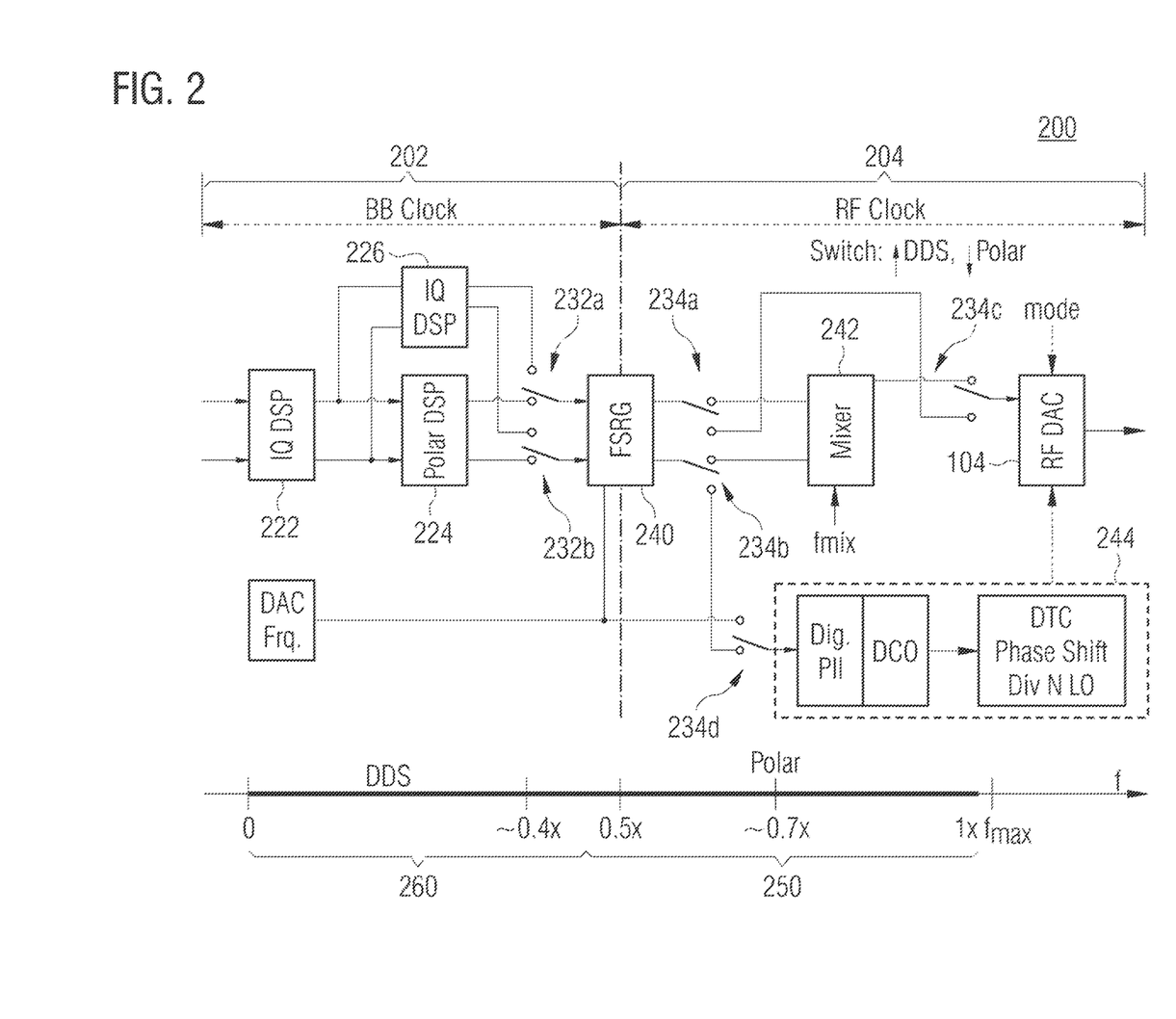
FIG. 2 schematically illustrates an example of a radio frequency signal synthesizer supporting two modes of operation.

FIG. 2 schematically illustrates an example of a radio frequency signal synthesizer 200 supporting two modes of operation. In particular, FIG. 2 shows an example of a joined DDS/Polar Transmitter. That is, the first operation mode uses polar modulation and the second operation mode uses direct digital synthesis. In the Direct Digital Synthesis (DDS), the DAC directly transmits the RF waveform s(t):

$$s(t) = \text{Re}\left[bb(t) \cdot e^{\sqrt{-1} \cdot \frac{f_{ch}}{f_{clk}} \cdot t}\right],$$

with bb(t) being the Baseband Signal and $f_{ch}$ being the channel frequency or carrier frequency.

Both in Polar Mode (used as an example for the first operation mode) as well as in DDS Mode, the DAC has a single input. In Polar Mode, the DAC clock is modulated with the instantaneous frequency, the input of the DAC values receives a sign change at half period length to realize a channel frequency at clock rate. If the DAC given by a polar Transmitter uses an unmodulated clock and input data having comprising positive and negative values, the RF signal can be transmitted via DDS Mode. In the digital domain, a DDS Transmitter may include an additional mixer in front of the DAC which is not needed for the Polar transmitter. If the mixer has only coefficients of magnitude one, it could even be realized as sign change within the DAC. Thus, if the Hardware of a polar Transmitter is given, a Direct Digital Synthesis Transmitter can be build up with small changes.

The radiofrequency signal synthesizer 200 is split into a baseband portion 202 running at a baseband clock and into a radiofrequency portion 204 running at a radiofrequency clock. For the illustration in FIG. 2, it is assumed that the generation of the baseband signal is based on I- and Q-components. The I- and Q-components of the baseband signals may, for example, undergo some preprocessing using a digital signal processor 222. For the first mode of operation, the Cartesian I- and Q-coordinates of the baseband signal are transformed into a polar representation by means of a polar digital signal processor 224. A conventional polar digital signal processor 224 may operate a cordic algorithm (CORIC) to determine a radius component and a phase component for each pair of I- and Q-baseband samples. Switching between the first operation mode and the second operation mode is illustrated by means of switches 232a and 232b in the baseband domain 202 as well as by switches 234a to 234d in the radiofrequency domain. For the second mode of operation, the switches 232a, 232b, 234a to 234d are operated in the upper position so that, in the baseband portion 202, the output of the polar digital signal processor 224 is not forwarded to a fractional sample rate converter 240 which upsamples the signals from the rate of the baseband domain to the rate of the radiofrequency domain 204. To further process the I/Q samples in the second operation mode, an additional I/Q processor 226 may be present, further modifying the I/Q samples according to conventional signal processing algorithms.

The digital signal processor 222 and the further digital signal processor 226 may be summarized as an I/Q representation circuit that is configured to generate an in-phase and a quadrature component of the baseband signal. Likewise, the polar digital signal processor 224 may be characterized as a polar representation circuit configured to generate an amplitude value and a phase value of a baseband signal. By means of the fractional sample rate converter 240, the sample frequency of the samples of the amplitude value and the phase value and, likewise, of the in-phase and the quadrature component, are up-sampled such that for each clock cycle generated by means of the controlled oscillator 244, a sample value of a polar representation or of the I/Q representation is present.

For the second operation mode, a mixer circuit 242 is present in the radiofrequency domain to up-mix the baseband signal in the I/Q representation to the channel frequency to digitally generate the radiofrequency signal. That is, the mixer circuit 242 directly generates the frequency range of the radiofrequency signal using the baseband signal. If the radiofrequency signal synthesizer 200 is operated in the second operation mode, the switches 234a to 234d are in the upper position so that the samples are fed through the mixer circuit 242, generating the real valued radio frequency waveform as an input for DAC 104, which provides its analog representation at output of the DAC. In this operation mode, the radiofrequency digital-to-analog converter 104 simply serves to provide an analog representation of an eventually oversampled radiofrequency waveform provided in the digital domain by means of a mixer circuit 242.

In the first operation mode, the radius component of the polar representation of the baseband signal is directly fed to the radiofrequency digital-to-analog converter 104, whose operation frequency is determined by the controlled oscillator 244 operated according to the first mode, i.e. varying the cycle times of the individual cycles of the oscillation signal based on the phase component of the polar representation of the signal.

The lower graph of FIG. 2 schematically illustrates the extended overall frequency range that can be covered when using an example of a radiofrequency signal synthesizer circuit as described herein. In the first mode of operation, it is assumed that the controlled oscillator is capable of generating frequencies between approx. 45% and 100% of its maximum frequency $f_{max}$, covering a first frequency range 250. Further, when operating the identical hardware in the second operation mode, frequencies between 0 Hz and approximately 50% of the maximum frequency of the controlled oscillator 104 can be supported, covering a second frequency range 260. Assuming a supported frequency range of roughly 55% of the maximum frequency of a controlled oscillator, FIG. 2 impressively illustrates that the full frequency range up to the maximum frequency of the controlled oscillator can be supported by additionally using the second operation mode with an already given hardware configuration. This may serve to extensively save on controlled oscillators, their associated digital-to-analog converters and further hardware components within a single transmission chain. It may also be advantageous to switch to the second operation mode for frequencies that could also be supported using the first operation mode, i.e. in an overlapping frequency range where principally both operation modes could be used. According to some examples, less energy is consumed in the second operation mode than in the first operation mode. Hence, early switching into the second operation mode may be desirable.

For example, a single combination of a controllable oscillator having a comparatively low bandwidth and an associated analog-to-digital converter may serve to cover channel frequencies between 3 GHz and 3.9 GHz (in the first operation mode) and between 0.1 GHz and 1 GHz (in the second operation mode). In other words, this may serve to support the 3GGP standardized bands 42 and 43 as well as the bands 5, 6, 8, 12 to 14, 17 to 20, 26 to 28, and 44. If, for example, a DCO supports the 3.5 GHz Band 43 with an upper band edge of 3.8 GHz for a Polar transmitter, channel frequencies from 0 . . . 1.14 GHz can be supported in DDS mode. This is coverage of the whole low band and all upcoming frequencies inside the low band. Further, the possibility exists to extend the second frequency range to, for example, up to 50% of the maximum frequency.

From existing Polar Transmitters it is known that the 3rd harmonic of the transmit channel frequency, which is the closest harmonic of significant strength for nearly rectangular signals, is well suppressed by existing external analog components, e.g. by antenna matching networks. Therefore, no external anti alias filters are needed. If in the DDS mode of the example of FIG. 2, a transmit channel frequency of ¼ of the DAC clock is chosen (as illustrated in FIG. 3), the first alias frequency will be at ¾ of the DAC clock, which is the 3rd harmonic of the transmitted channel frequency. For this setup, therefore, there is no anti alias filter required, since the 3rd harmonic of the transmit channel frequency are sufficiently suppressed by the existing components.

The mixer frequency $f_{mix}$ (and so the channel frequency) and the clock frequency of the DAC can be chosen independently. This can be advantageous in some situations. If, e.g. the DAC Clock was 2.4 GHz and the channel frequency was 825 MHz (used in Band 5, 18, 26), the resultant alias frequency would be 1575 MHz. The generated alias might disturb GPS reception at 1575.42 MHz, having 1 . . . 2 MHz bandwidth. Since the DAC clock generated by the controllable oscillator 244 is variable, it can be set to, for example, 2.42 GHz at a channel frequency of 825 MHz so that an alias is generated at 1595 MHz, which is outside of the critical GPS band. Generally, for support of the Polar transmit (Tx) mode, the DCO/DTC is already build up with fine granularity. According to some examples, this is used in a way that for a wanted channel frequency the mixer performs the coarse frequency steps and the DCO/DTC the fine frequency steps resulting in the desired channel frequency.

Figure 4:
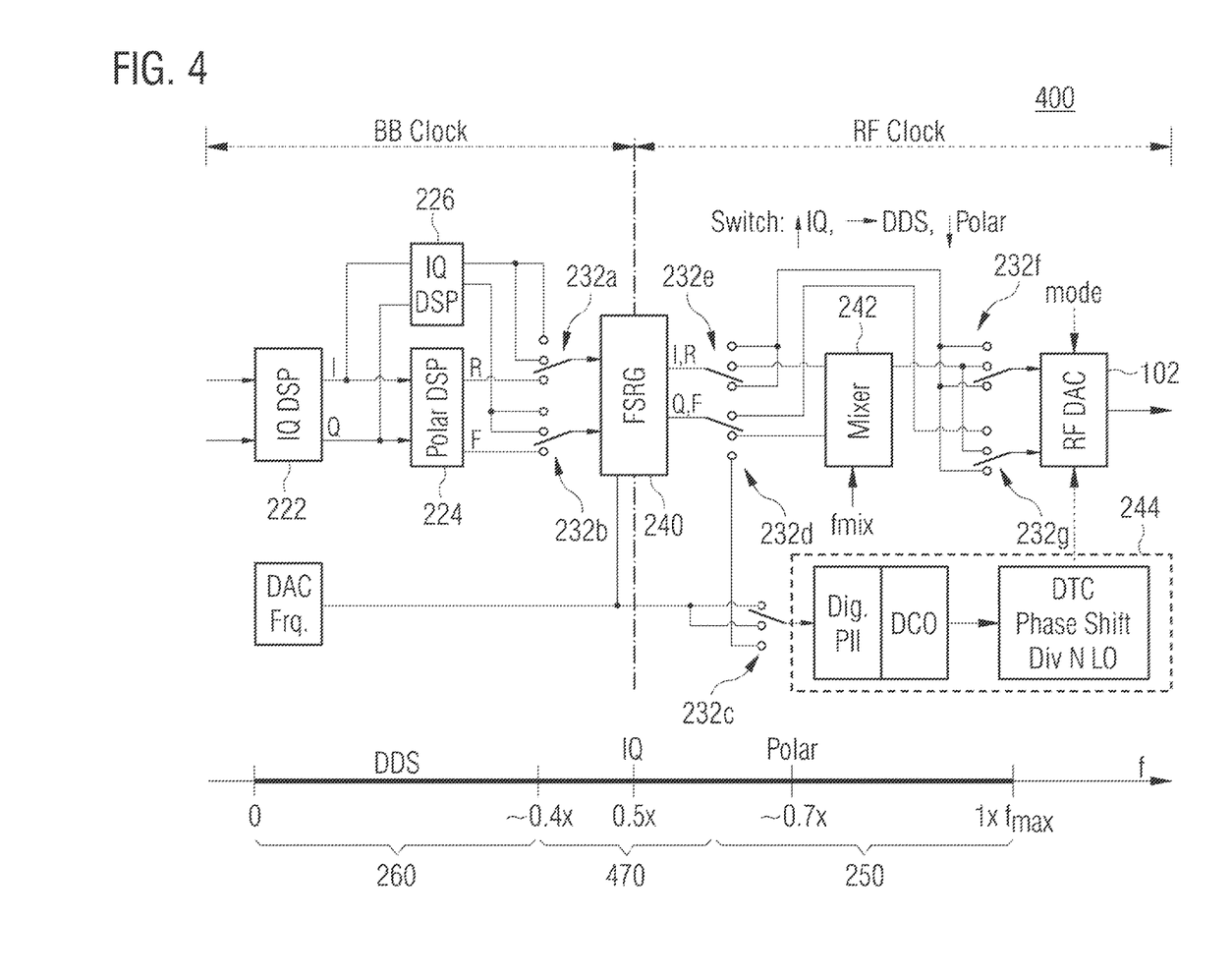
FIG. 4 schematically illustrates an example of a radio frequency signal synthesizer supporting three modes of operation.

FIG. 4 illustrates a further example of a radiofrequency signal synthesizer 400 supporting three different operation modes. As far as the first and the second operation mode are concerned, reference is made to the explanation of the example illustrated in FIG. 2. Further, components performing the same functionality as in the example of FIG. 2 are given the same reference numbers and a repeated explanation of their functionality is omitted for reasons of conciseness.

Other than the example of FIG. 2, the example illustrated in FIG. 4 comprises seven three-stage switches 232a-232g to implement also a third operation mode for a third frequency range, in which the radiofrequency signal is generated using classical I/Q modulation, as illustrated by the middle graph of FIG. 3. In order to enable the functionality of the third operation mode, the switches 232a-232g are operated in the upper position which does not generate any difference between the second operation mode and the third operation mode for the processing of the I/Q signals in the baseband domain. The third frequency range comprises a frequency of 50% of a maximum frequency of the controlled oscillator. In the third frequency range, a generated radio frequency signal has a center frequency of about 50% the frequency of the clock signal. In the radio frequency domain, however, the radio frequency digital-to-analog converter 102 is operated in classical I/Q generation mode. Therefore, no synthesis of the radiofrequency waveform is performed before the I/Q components are converted from the digital to the analog domain. To achieve this, switches 232d-232f, when operated in the third operation mode, serve to bypass the mixer circuit 242 to enable operation of the radiofrequency DAC 102 in classical I/Q mode. The lower illustration of FIG. 4 illustrates that the frequency coverage can be further extended by the third operation mode, additionally supporting a third frequency range 470 between the first frequency range 250 and the second frequency range 260, covering the full frequency range from zero Hertz up to the maximum frequency $f_{max}$ using only a single controlled oscillator. Using an example with three operation modes, a controlled oscillator having a smaller bandwidth may be used, which may consume less energy than an oscillator having a higher bandwidth.

In other words, FIG. 4 shows a joined Polar/IQ/DDS Transmitter. The mixer circuit 242 of the example is used only for DDS mode since in IQ and Polar mode the mixing on channel frequency can be done inside the DAC. One may further jointly summarize the examples of FIGS. 2 and 4 as sharing the same LO clock (DCO) for transmitting RF signals using either a modulated clock for frequency range A (Polar Mode Tx) or an unmodulated clock for frequency range B (in IQ Mode or in Direct Digital Synthesis Mode). FIG. 4 thus illustrates an example for frequency ranges that may be covered by a single DCO.

Figure 5:
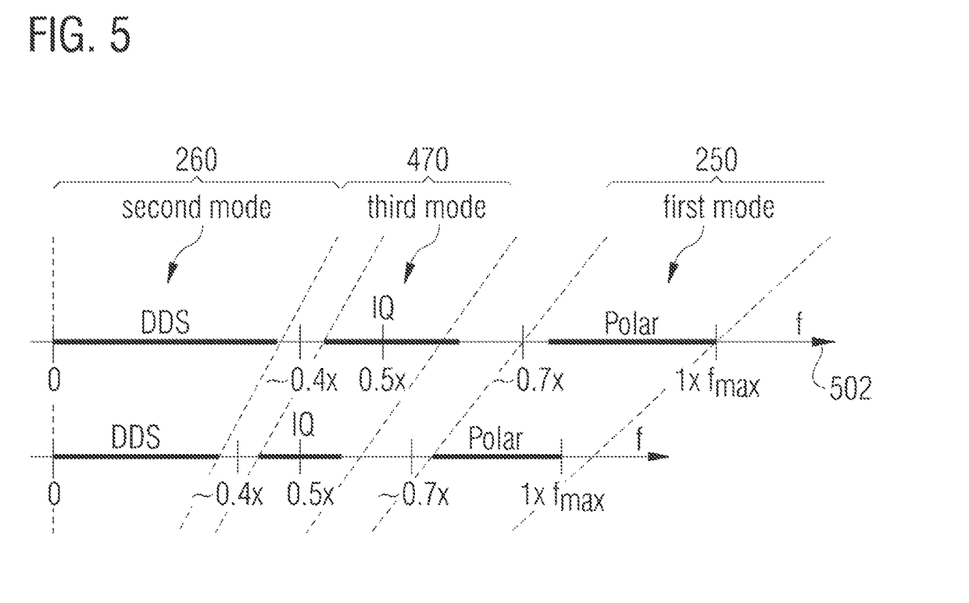
FIG. 5 illustrates an example for frequency ranges that may be covered by a single DCO.

FIG. 5 emphasizes the wide frequency covered by only two joined Polar/IQ/DDS Transmitters with different maximal Tx frequency. To this end, FIG. 5 illustrates schematically that it may be feasible to cover the frequency range from 0 Hz up to the maximum frequency of a first controlled oscillator by two complete transmit chains, when the controlled oscillator of a first transmit chain 502 and a second controlled oscillator of a second transmit chain 504 support appropriately chosen maximum oscillation frequencies and if both transmit chains support the three operation modes elaborated on with respect to FIG. 4. In the example of FIG. 5, the second oscillator of the second transmit chain 504 has a maximum supported frequency of roughly 80% of the maximum frequency of the first oscillator, the second transmit chain may support—in the first operation mode—frequencies that the first transmit chain is no longer able to support in the first operation mode due to the limited bandwidth of the controllable oscillator of the first transmit chain. In such a configuration, the frequencies supported by the second transmit chain 504 in the third operation mode may entirely close the gap between the frequencies supported by the first transmit chain 502 in the second mode and the third mode. As it becomes apparent from FIG. 5, only two pairs of controlled oscillators and associated radiofrequency digital-to-analog converters may be sufficient to almost entirely cover the full frequency range from 0 Hz up to the maximum frequency of the controlled oscillator supporting the higher maximum frequency. Using an example as illustrated in FIG. 5, two controlled oscillators having a comparatively small bandwidth may be used, which may consume less energy than a single oscillator having a higher bandwidth. Further examples may also use 3 or more (e.g. 4, 5, 6,) controlled oscillators supporting multiple operation modes to allow to use oscillators with a smaller bandwidth, which may, in turn, be cheaper or consume less energy or area.

Figure 6:
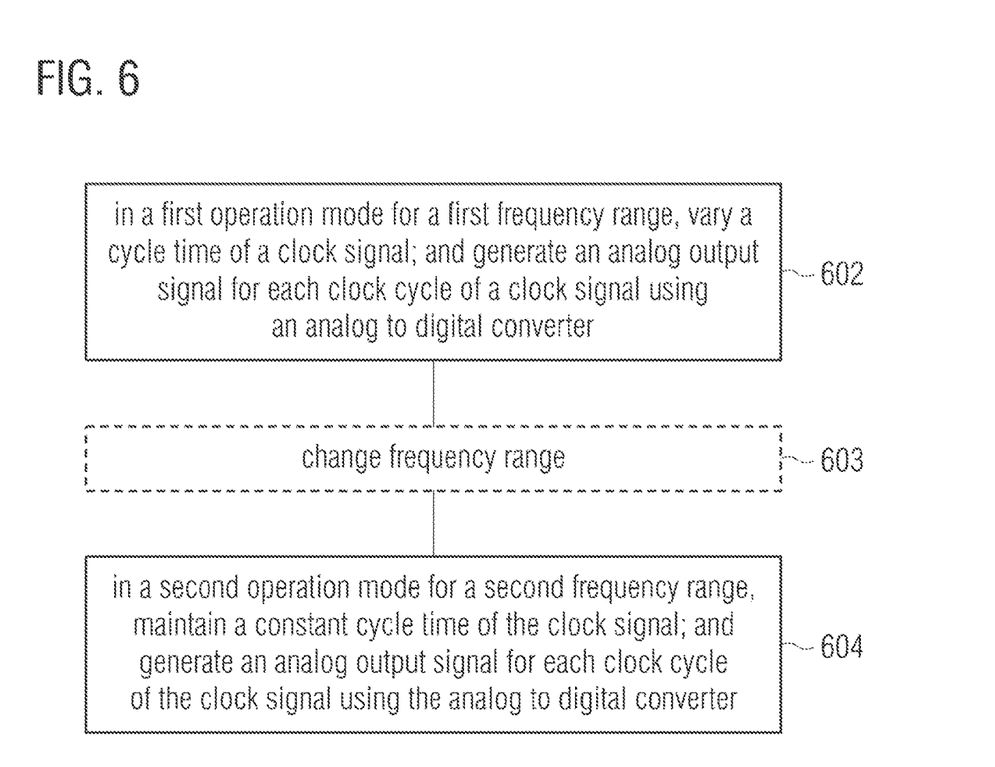
FIG. 6 illustrates a flow chart of a method for synthesizing a radio frequency signal.

FIG. 6 schematically illustrates a flowchart of a method for generating a radiofrequency signal. The method comprises generating a radiofrequency signal in a first operation mode 602 and generating the radiofrequency signal in a second operation mode 604. The first operation mode 602 comprises generating an analog output signal for each clock cycle of a clock signal using an analog-to-digital converter and varying a cycle time of the clock signal for a radiofrequency signal to be generated in a first frequency range. The second operation mode comprises generating the analog output signal for each clock cycle of the clock signal, using the analog-to-digital converter, while the cycle time is maintained constant for the generation of a radiofrequency signal in a second frequency range.

According to further examples, the frequency range of the generated radiofrequency signal may optionally be changed in a changing step 603, so that, in response to the change of the frequency range, the operation mode of the digital-to-analog converter is changed. For example, if the frequency range is lowered, the operation mode may be changed from the first operation mode to the second operation mode. Likewise, if the frequency range or the center frequency of the channel of a radiofrequency signal is increased, the operation mode may be changed from the second operation mode to the first operation mode.

Figure 7:
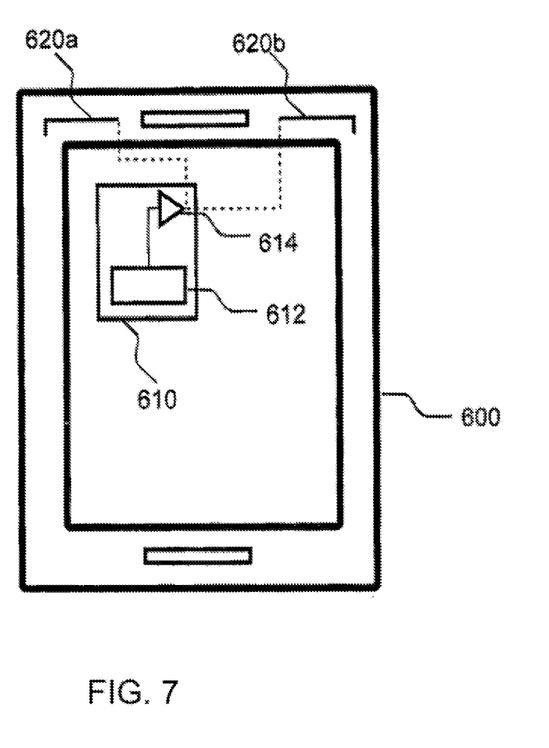
FIG. 7 illustrates an example of a mobile telecommunications device.

FIG. 7 schematically illustrates an example of a mobile telecommunications device 600 comprising a transmitter 610 coupled to two antennas 620a and 620b. The number of antennas is just an example and further examples of mobile telecommunications device may comprise more or less antennas. The transmitter 610 comprises an example of a radio frequency signal synthesizer circuit 612 as described herein and a power amplifier 614 configured to amplify the radio frequency signal as generated by the radio frequency signal synthesizer circuit 612.

Mobile telecommunication devices as disclosed in FIG. 7 using an example of a transceiver according to the examples described herein may operate according to every known and future telecommunication standard, such as for example: one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

A mobile telecommunications device may correspond to a smartphone, a cell phone, User Equipment (UE), a laptop, a notebook, a personal computer, a Personal Digital Assistant (PDA), a Universal Serial Bus (USB) -stick, a tablet computer, a car, etc. A mobile transceiver or terminal may also be referred to as UE or user in line with the 3GPP terminology. A base station transceiver can be located in the fixed or stationary part of the network or system. A base station transceiver may, for example, correspond to a remote radio head, a transmission point or an access point. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

Example 1 is a radio frequency signal synthesizer circuit, comprising an digital to analog converter configured to generate an analog output signal for each clock cycle of a clock signal to provide the radio frequency signal; and a controlled oscillator to generate the clock signal, the controlled oscillator configured to vary a cycle time of the clock signal for a radio frequency signal in a first frequency range in a first operation mode or to maintain a constant cycle time for a radio frequency signal in a second frequency range in a second operation mode, the second frequency range being different than the first frequency range.

In example 2, in the radio frequency signal synthesizer circuit of example 1, the second frequency range is lower than the first frequency range In example 3, in the radio frequency signal synthesizer circuit of example 1 or 2, the digital to analog converter is configured to output a single amplitude value for a full cycle of the radio frequency signal at a time instant given by the clock cycle of the clock signal.

In example 4, in the radio frequency signal synthesizer circuit of example 1 or 2, the digital to analog converter is configured to output one of multiple samples of a full cycle of the radio frequency signal at a time instant given by the clock cycle of the clock signal.

In example 5, in the radio frequency signal synthesizer circuit of any of the preceding examples, the controlled oscillator is capable of providing a maximum frequency; and the first frequency range of the first operation mode ranges up to the maximum frequency and the second frequency range of the second operation mode ranges up to 50% of the maximum frequency.

In example 6, the radio frequency signal synthesizer circuit of any of the preceding examples further comprises a polar representation circuit configured to generate an amplitude value and a phase value of a base band signal for each clock cycle of the radio frequency signal.

In example 7, the radio frequency signal synthesizer circuit of any of the preceding examples, further comprises an I/Q representation circuit configured to generate an In-Phase component and a Quadrature component of a base band signal; and a mixer circuit configured to combine the In-Phase and the Quadrature component of the base band signal to provide a digital representation of the radio frequency signal as an input to the digital to analog converter.

In example 8, in the radio frequency signal synthesizer circuit of example 7, the mixer circuit is further configured to upmix the baseband signal to the second frequency range, wherein an operating frequency of the digital to analog converter is within the second frequency range.

In example 9, in the radio frequency signal synthesizer circuit of any of the preceding examples, the digital to analog converter is further configured to operate in a third operation mode for a third frequency range in which an In-Phase component of the radio frequency signal is generated in a first clock cycle of the clock signal and in which a Quadrature-component of the radio frequency signal is generated in a subsequent second clock cycle of the clock signal.

In example 10, in the radio frequency signal synthesizer circuit of any of the preceding examples, the second frequency range is contained within the interval starting at 0.1 GHz and ending at 1 GHz; and the first frequency range is contained within the interval starting at 3.0 GHz and ending at 3.9 GHz.

In example 11, in the radio frequency signal synthesizer of any of examples 9 and 10, the third frequency range comprises a frequency of 50% of a maximum frequency of the controlled oscillator.

In example 12, in the radio frequency signal synthesizer of any of examples 9 to 11, the third frequency range is at least partly contained within the interval starting at 1.3 GHz and ending at 1.7 GHz.

In example 13, in the radio frequency signal synthesizer circuit of any of the preceding examples, the first frequency range comprises one of the bands 42 and 43; and the second frequency range comprises one of the bands 5, 6, 8, 12, 13, 14, 17, 18, 19, 20, 26, 27, 28, 44 according to the 3GPP Standard.

Example 14 is a method for generating a radio frequency signal, comprising generating an analog output signal for each clock cycle of a clock signal using an digital to analog converter to provide the radio frequency signal; and varying a cycle time of the clock signal for a radio frequency signal in a first frequency range in a first operation mode or maintain a constant cycle time for a radio frequency signal in a second frequency range in a second operation mode, the second frequency range being different than the first frequency range.

In example 15, in the method of example 14, the second frequency range is lower than the first frequency range.

In example 16, the method of examples 14 or 15 comprises using the digital to analog converter to output a single amplitude value for a full cycle of the radio frequency signal at a time instant given by the clock cycle of the clock signal.

In example 17, the method of examples 14 or 15, comprises using the digital to analog converter to output one of multiple samples of a full cycle of the radio frequency signal at a time instant given by the clock cycle of the clock signal.

In example 18, the method of any of examples 14 to 17 comprises operating the digital to analog converter in the first operation mode in a first frequency range ranging up to a maximum frequency supported by the controlled oscillator and in the second operation mode in a second frequency range ranging up to 50% of the maximum frequency.

In example 19, the method of any of examples 14 to 18 further comprises generating an amplitude value and a phase value of a base band signal for each clock cycle of the radio frequency signal.

In example 20, the method of any of examples 14 to 19 further comprises generating an In-Phase component and a Quadrature component of a base band signal; and combining the In-Phase and the Quadrature component of the base band signal to provide a digital representation of the radio frequency signal as an input to the digital to analog converter.

In example 21, the method of any of examples 14 to 20 further comprises operating the digital to analog converter in a third operation mode to generate an In-Phase component of the radio frequency signal in a first clock cycle of the clock signal and to generate a Quadrature-component of the radio frequency signal in a subsequent second clock cycle of the clock signal.

Example 22 is a method for generating a radio frequency signal, comprising: in a first operation mode, varying a cycle time of a clock signal to generate a radio frequency signal in a first frequency range; generate an analog output signal for each clock cycle of the clock signal using an digital to analog converter; changing the frequency range for the radio frequency signal to a second frequency range, the second frequency range being different than the first frequency range; in a second operation mode, maintain a constant cycle time of the clock signal to generate the radio frequency signal in the second frequency range; and generate an analog output signal for each clock cycle of the clock signal using the digital to analog converter.

In example 23, in the method of example 22, the second frequency range has a mean frequency of less than 30% of a mean frequency of the first frequency range.

Example 24 is a transmitter circuit, comprising a radio frequency signal synthesizer circuit according to any of examples 1 to 13; and a power amplifier configured to amplify the radio frequency signal.

Example 25 is a Mobile telecommunications device comprising a transmitter according to example 24.

Example 26 is a computer program having a program code for performing, when executed by a programmable processor, a method according to any of examples 14 or 15.

Example 27 is a non-transitory computer readable storage medium comprising a computer program having a program code for performing, when executed by a programmable processor, a method according to any of examples 14 or 15.

The aspects and features mentioned and described together with one or more of the previously detailed examples and figures may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A radio frequency signal synthesizer circuit, comprising:
    a digital to analog converter configured to generate an analog output signal for each clock cycle of a clock signal to provide the radio frequency signal; and
    a controlled oscillator to generate the clock signal, the controlled oscillator configured to vary a cycle time of the clock signal for a radio frequency signal in a first frequency range in a first operation mode or to maintain a constant cycle time for a radio frequency signal in a second frequency range in a second operation mode, the second frequency range being different than the first frequency range.

2. The radio frequency signal synthesizer circuit of claim 1, wherein the second frequency range is lower than the first frequency range.

3. The radio frequency signal synthesizer circuit of claim 1, wherein the digital to analog converter is configured to output a single amplitude value for a full cycle of the radio frequency signal at a time instant given by the clock cycle of the clock signal.

4. The radio frequency signal synthesizer circuit of claim 1, wherein the digital to analog converter is configured to output one of multiple samples of a full cycle of the radio frequency signal at a time instant given by the clock cycle of the clock signal.

5. The radio frequency signal synthesizer circuit of claim 1, wherein the controlled oscillator is capable of providing a maximum frequency; and
    wherein the first frequency range of the first operation mode ranges up to the maximum frequency and wherein the second frequency range of the second operation mode ranges up to 50% of the maximum frequency.

6. The radio frequency signal synthesizer circuit of claim 1, further comprising:
    a polar representation circuit configured to generate an amplitude value and a phase value of a base band signal for each clock cycle of the radio frequency signal.

7. The radio frequency signal synthesizer circuit of claim 1, further comprising:

an I/Q representation circuit configured to generate an In-Phase component and a Quadrature component of a base band signal; and a mixer circuit configured to combine the In-Phase and the Quadrature component of the base band signal to provide a digital representation of the radio frequency signal as an input to the digital to analog converter.

8. The radio frequency signal synthesizer circuit of claim 7, wherein the mixer circuit is further configured to upmix the baseband signal to the second frequency range, wherein an operating frequency of the digital to analog converter is within the second frequency range.

9. The radio frequency signal synthesizer circuit of claim 1, wherein the digital to analog converter is further configured to operate in a third operation mode for a third frequency range in which an In-Phase component of the radio frequency signal is generated in a first clock cycle of the clock signal and in which a Quadrature-component of the radio frequency signal is generated in a subsequent second clock cycle of the clock signal.

10. The radio frequency signal synthesizer circuit of claim 1, wherein the second frequency range is contained within the interval starting at 0.1 GHz and ending at 1 GHz; and wherein the first frequency range is contained within the interval starting at 3.0 GHz and ending at 3.9 GHz.

11. The radio frequency signal synthesizer of claim 9, wherein the third frequency range comprises a frequency of 50% of a maximum frequency of the controlled oscillator.

12. The radio frequency signal synthesizer of claim 9, wherein the third frequency range is at least partly contained within the interval starting at 1.3 GHz and ending at 1.7 GHz.

13. The radio frequency signal synthesizer circuit of claim 1, wherein the first frequency range comprises one of the bands 42 and 43; and wherein the second frequency range comprises one of the bands 5, 6, 8, 12, 13, 14, 17, 18, 19, 20, 26, 27, 28, 44 according to the 3GPP Standard.

14. A method for generating a radio frequency signal, comprising:

generating an analog output signal for each clock cycle of a clock signal using an digital to analog converter to provide the radio frequency signal; and varying a cycle time of the clock signal for a radio frequency signal in a first frequency range in a first operation mode or maintain a constant cycle time for a radio frequency signal in a second frequency range in a second operation mode, the second frequency range being different than the first frequency range.

15. The method of claim 14, wherein the second frequency range is lower than the first frequency range.

16. The method of claim 14, comprising using the digital to analog converter to output a single amplitude value for a full cycle of the radio frequency signal at a time instant given by the clock cycle of the clock signal.

17. The method of claim 14, comprising using the digital to analog converter to output one of multiple samples of a full cycle of the radio frequency signal at a time instant given by the clock cycle of the clock signal.

18. The method of claim 14, comprising:

operating the digital to analog converter in the first operation mode in a first frequency range ranging up to a maximum frequency supported by the controlled oscillator and in the second operation mode in a second frequency range ranging up to 50% of the maximum frequency.

19. The method of claim 14, further comprising:

generating an amplitude value and a phase value of a base band signal for each clock cycle of the radio frequency signal.

20. The method of claim 14, further comprising:

generating an In-Phase component and a Quadrature component of a base band signal; and combining the In-Phase and the Quadrature component of the base band signal to provide a digital representation of the radio frequency signal as an input to the digital to analog converter.

21. The method of claim 14, further comprising: operating the digital to analog converter in a third operation mode to generate an In-Phase component of the radio frequency signal in a first clock cycle of the clock signal and to generate a Quadrature-component of the radio frequency signal in a subsequent second clock cycle of the clock signal.

22. A method for generating a radio frequency signal, comprising:

in a first operation mode, varying a cycle time of a clock signal to generate a radio frequency signal in a first frequency range;

generate an analog output signal for each clock cycle of the clock signal using an digital to analog converter;

changing the frequency range for the radio frequency signal to a second frequency range, the second frequency range being different than the first frequency range;

in a second operation mode, maintain a constant cycle time of the clock signal to generate the radio frequency signal in the second frequency range; and generate an analog output signal for each clock cycle of the clock signal using the digital to analog converter.

23. The method of claim 22, wherein the second frequency range has a mean frequency of less than 30% of a mean frequency of the first frequency range.

24. A Mobile telecommunications device comprising a transmitter circuit, the transmitter circuit comprising:

a radio frequency signal synthesizer circuit according to claim 1; and a power amplifier configured to amplify the radio frequency signal.

* * * * *